(12) United States Patent
Lee

(10) Patent No.: US 6,406,973 B1
(45) Date of Patent: Jun. 18, 2002

(54) TRANSISTOR IN A SEMICONDUCTOR DEVICE AND METHOD OF MANUFACTURING THE SAME

(75) Inventor: Jung Ho Lee, Seoul (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 35 days.

(21) Appl. No.: 09/607,106

(22) Filed: Jun. 29, 2000

(30) Foreign Application Priority Data

Jun. 29, 1999 (KR) ............................................. 99-25434

(51) Int. Cl.[7] ...................... H01L 21/76; H01L 21/8238
(52) U.S. Cl. ...................... 438/416; 438/216; 438/222; 438/223; 438/261; 438/287; 438/300; 438/303; 438/416; 438/418; 438/564; 438/591; 438/595; 438/589; 438/522; 438/607; 257/213; 257/325; 257/329; 257/336; 257/344; 257/346; 257/350; 257/382; 257/384; 257/386; 257/408; 257/591; 257/595

(58) Field of Search ............................... 438/216, 222, 438/223, 261, 267, 300, 303, 416, 418, 564, 591, 595, 589, 522, 607; 257/213, 325, 329, 336, 344, 346, 350, 382, 384, 386, 408, 591, 595

(56) References Cited

U.S. PATENT DOCUMENTS

| 4,728,623 A | 3/1988 | Lu et al. ........................ 437/52 |
| 4,738,937 A | 4/1988 | Parsons ....................... 437/180 |

(List continued on next page.)

FOREIGN PATENT DOCUMENTS

| JP | 54-158880 | 12/1979 |
| JP | 2-37745 | 2/1990 |
| JP | 2-260667 | 10/1990 |
| JP | 8-236728 | 9/1996 |
| JP | 10-107219 | 4/1998 |
| JP | 11-97519 | 4/1999 |

Primary Examiner—Steven Loke
Assistant Examiner—Donghee Kang
(74) Attorney, Agent, or Firm—Pennie & Edmonds

(57) ABSTRACT

The present invention relates to a transistor in a semiconductor device and method of manufacturing the same, more particularly to a new dual gate P[+] salicide forming technology having an elevated channel and a source/drain using the selective SiGe epi-silicon growth technology. It relates to manufacturing of a high performance surface channel PMOS salicide which has the following effects: it can increase the current driving force by using an elevate channel structure of Si/SiGe/Si at the channel portion for increasing the current driving force, thus making the stress induced by the buried SiGe layer increase the carrier mobility, it has an increased current driving force effect due to reduction of the work function of the poly-SiGe being mid-band gap materials, it can improve the short channel effect by an improved gate poly depletion suppression due to an increased activation of boron at SiGe, it can suppress the leakage current at the junction by forming a buried/elevated SiGe layer at the junction portion to form a band gap engineered junction, and it can obtain a still shallower junction due to suppression of diffusion of boron doped at the junction layer.

22 Claims, 2 Drawing Sheets

U.S. PATENT DOCUMENTS

| | | | |
|---|---|---|---|
| 4,918,029 A | 4/1990 | Kim | 437/119 |
| 5,004,702 A | 4/1991 | Samata et al. | 437/57 |
| 5,030,583 A | 7/1991 | Beetz | 437/39 |
| 5,032,538 A | 7/1991 | Bozler et al. | 437/83 |
| 5,045,494 A | 9/1991 | Choi et al. | 437/60 |
| 5,272,109 A | 12/1993 | Motoda | 437/129 |
| 5,322,802 A | 6/1994 | Baliga et al. | 437/22 |
| 5,322,814 A | 6/1994 | Rouse et al. | 437/110 |
| 5,378,652 A | 1/1995 | Samata et al. | 437/189 |
| 5,432,121 A | 7/1995 | Chan et al. | 437/95 |
| 5,435,856 A | 7/1995 | Rouse et al. | 136/225 |
| 5,494,837 A | 2/1996 | Subramanian et al. | 437/34 |
| 5,508,225 A | 4/1996 | Kadoiwa | 437/129 |
| 5,567,652 A | 10/1996 | Nishio | 437/200 |
| 5,599,724 A | 2/1997 | Yoshida | 437/40 |
| 5,627,102 A | 5/1997 | Shinriki et al. | 437/192 |
| 5,633,201 A | 5/1997 | Choi | 438/620 |
| 5,744,377 A | 4/1998 | Sekiguchi et al. | 438/674 |
| 5,773,350 A | 6/1998 | Herbert et al. | 438/364 |
| 5,804,470 A | 9/1998 | Wollesen | 438/141 |
| 6,004,137 A * | 12/1999 | Crabbe et al. | 437/40 |
| 6,187,641 B1 * | 2/2001 | Rodder et al. | 438/299 |

* cited by examiner

TRANSISTOR IN A SEMICONDUCTOR DEVICE AND METHOD OF MANUFACTURING THE SAME

BACKGROUND OF THE INVENTION

1. Field of the Invention

The invention relates generally to a transistor in a semiconductor device and method of manufacturing the same, and more particularly to, a transistor in a semiconductor device in which channels are formed in an elevated channel structure of Si/SiGe/Si and a buried/elevated SiGe layer is formed at the junction thereof, thus improving the electric characteristic of the transistor, and method of manufacturing the same.

2. Description of the Prior Art

Generally, as the semiconductor device becomes higher integrated, miniaturized and speeder, transistors having an improved short channel effect (SCE) capability, an improved hot carrier suppression (HCS) capability and an improved current driving force are required.

FIGS. 1A through 1D are sectional views of a device for explaining a conventional method of manufacturing a transistor in a semiconductor device.

Referring now to FIG. 1A, a device separation film 12 is formed at a silicon substrate 11 to define an active region and a field region. Then, a N-well 13 is formed in order to form a PMOS transistor. After ion implantation process for controlling the threshold voltage is performed, a gate oxide film 14 and a gate electrode 15 are sequentially formed.

Referring to FIG. 1B, a gate spacer 16 is formed on both sides of the gate oxide film 14 and the gate electrode 15. Next, a junction 17 is formed by ion implantation for formation of source/drain and for gate doping.

Referring to FIG. 1C, a Ti layer 18 is deposited on the entire structure. Then, the Ti layer 18 is processed by first annealing process, thus forming a TiSi$_2$ layer 18a on the junction 17 and the gate electrode 15 portions, in which silicon is exposed.

Referring to FIG. 1D, a portion of the Ti layer 18 not reacted by the first annealing process is removed by wet etching process and is then processed by second annealing process, thus forming a TiSi$_2$ layer 18a.

As described above, the manufacturing of a transistor by the surface channel PMOS Ti-salicide forming technology employing TiSi$_2$ results in a structure in which a TiSi$_2$ is made due to consumption of underlying silicon. This technology is very disadvantageous since the junction depth necessarily required is reduced as the device design rule is reduced. For example, in a device having the design rule of less than 0.13 μm, the junction depth is about 1000 Angstrom in case of a PMOS transistor. At this time, when Ti of about 300 Angstrom is deposited, loss of silicon about more than 200 Angstrom is required from the substrate surface. Thus, the device junction portion highly doped more than 1E20 ions/cm$^2$ is greatly damaged, thus significantly reducing the expected current driving force of the junction.

Meanwhile, in a SC-PMOS structure using an existing polysilicon, the gate poly depletion effect (PDE) is increased due to low boron activation, thus reducing the current driving force due to a weak gate electric field.

SUMMARY OF THE INVENTION

It is therefore an object of the present invention to provide a transistor in a semiconductor device in which channels are formed in an elevated channel structure of Si/SiGe/Si and a buried/elevated SiGe layer is formed at the junction thereof, thus improving the electric characteristic of the transistor, and method of manufacturing the same.

In order to accomplish the above object, the method of manufacturing a transistor in a semiconductor device according to the present invention is characterized in that it comprises the steps of forming a device separation film on a silicon substrate and then forming a well; after performing a first cleaning process, sequentially forming a first Si layer, a SiGe layer and a second Si layer by selective epi-silicon growth process and then performing ion implantation process for controlling the threshold voltage; forming a gate oxide film on the surface of the second Si layer and then forming a gate polysilicon layer pattern on the gate oxide film; forming gate spacers on both sides of the gate polysilicon layer pattern and then etching the gate polysilicon layer pattern by wet silicon dipping process, thus forming a remaining gate polysilicon layer pattern; after performing a second cleaning process, performing a selective SiGe growth process to form an epi-SiGe layer and a poly-SiGe layer at the exposed portions of the SiGe layer and the remaining gate polysilicon layer pattern, respectively; and after performing ion implantation process for source/drain formation and gate doping, depositing a Ti layer on the entire structure, removing the Ti layer that was not reacted after a first annealing process and then forming a TiSi$_2$ layer on the exposed portion of the epi-SiGe layer and the poly-SiGe layer by a second annealing process, thus completing a gate electrode, an elevated channel and a buried/elevated junction.

Also, in order to accomplish the above object, the transistor in a semiconductor device according to the present invention is characterized in that it comprises a silicon substrate in which a device separation film and a well are formed; an elevated channel in which a first Si layer, a SiGe layer and a second Si layer are stacked on some of the silicon substrate; a gate electrode in which a polysilicon layer, a poly-SiGe layer and a TiSi$_2$ layer are stacked on the channel, electrically separated from the channel by the gate oxide film; and a buried/elevated junction in which a first Si layer, a SiGe layer, an epi-SiGe layer and a TiSi$_2$ layer are stacked on both sides of the gate electrode, electrically separated from the gate electrode by a gate spacer.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
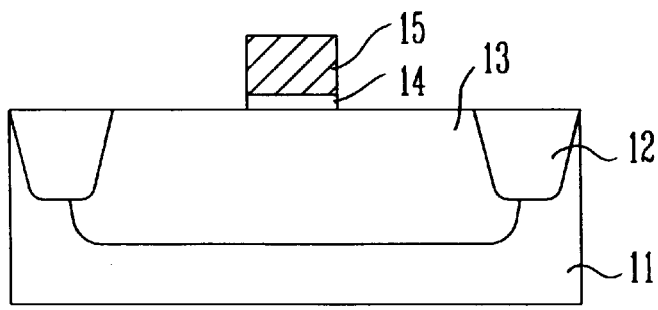
FIGS. 1A through 1D are sectional views of a device for explaining a conventional method of manufacturing a transistor in a semiconductor device.
Figure 1B:
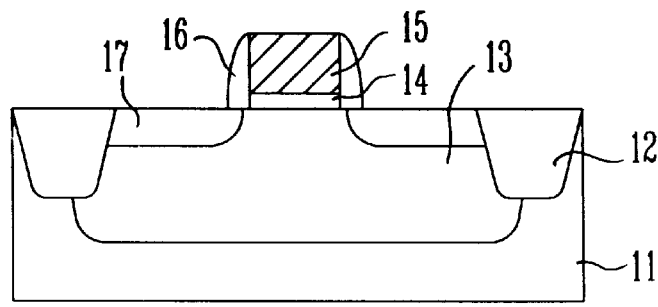
Figure 1C:
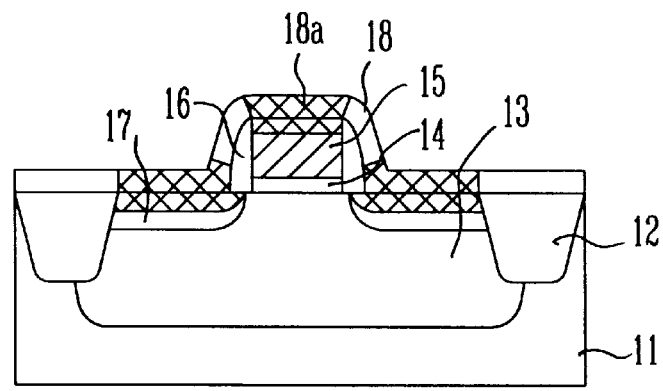
Figure 1D:
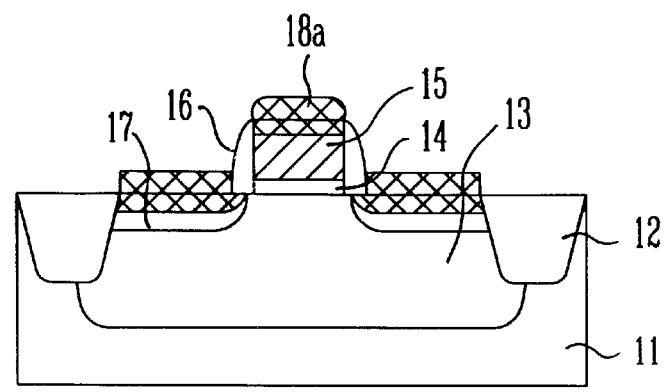

The present invention will be described in detail by way of a preferred embodiment with reference to accompanying drawings, in which like reference numerals are used to identify the same or similar parts.

FIGS. 2A through 2E are sectional views of a device for explaining a method of manufacturing a transistor in a semiconductor device according to one embodiment of the present invention.

Figure 2A:
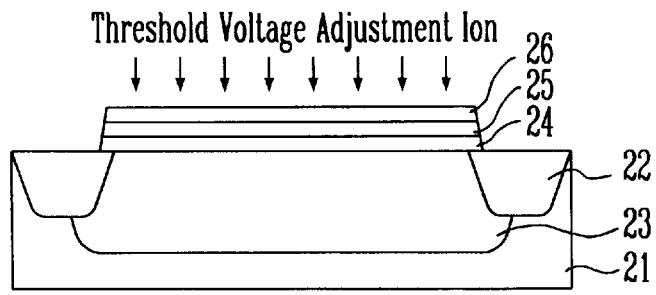
FIGS. 2A through 2E are sectional views of a device for explaining a method of manufacturing a transistor in a semiconductor device according to one embodiment of the present invention.

Referring now to FIG. 2A, a device separation film 22 is formed at a silicon substrate 21 to define an active region and a field region. Then, a well 23 is formed at the silicon substrate 21. After a native oxide film is removed by first cleaning process, a first Si layer 24, a SiGe layer 25 and a second Si layer 26 are sequentially formed by selective epitaxial silicon growth (SEG) process for forming an elevated channel and is then processed by ion implantation process for controlling the threshold voltage.

In the above, in case of a PMOS transistor, the well 23 is formed, by implanting ions of phosphorous having the dose of 1E13 through 3E13 ions/cm$^2$ at the energy of 800 through 1200 KeV and then by annealing them in the furnace at the temperature of about 950° C. for about 30 minutes in order to activate the dopants.

The first cleaning process includes an ex-situ cleaning process, and an in-situ cleaning process performed in the epitaxial silicon equipment. The ex-situ cleaning process is performed by RCA cleaning process or a combination of ozone cleaning process and HF dipping process. The in-situ cleaning process includes performing a hydrogen bake of 800 through 900° C. for 1 through 5 minutes before the first Si layer 24 is formed, in order to prevent generation of any oxide films.

The selective epitaxial silicon growth process for forming an elevated channel is performed to only the portion in which the surface of the silicon substrate 21 is exposed, using an ultra high vacuum chemical vapor deposition (UHVCVD) method or a low-pressure chemical vapor deposition (LPCVD) method, selectively. Each of the first Si layer 24, the SiGe layer 25 and the second Si layer 26 is sequentially formed in thickness of 50 through 150 Angstrom. In case of a low-pressure chemical vapor deposition (LPCVD) method, the selective epitaxial growth process includes the following deposition conditions: the deposition gases use DCS and HCl wherein DCS is 30 through 300 sccm upon deposition and HCl is 30 through 200 sccm, the deposition pressure is about 10 through 50 Torr and the deposition temperature is 750 through 950° C. In case of an ultra high vacuum chemical vapor deposition (UHVCVD) method, the selective epitaxial growth process includes the following deposition conditions: the deposition gases use $SiH_4$ or $Si_2H_6$, the deposition pressure is less than 1 Torr and the deposition temperature is 600 through 750° C. At this time, during the selective epitaxial silicon growth process, $GeH_4$ of 30 through 300 sccm is introduced together when forming the SiGe layer 25 for doping Ge. The ion implantation process for controlling the threshold voltage injects phosphorous (P) or arsenic (As) of dose of 1E11 through 5E12 ions/cm$^2$ at the energy of 50 through 150 KeV in case of a PMOS transistor.

Figure 2B:
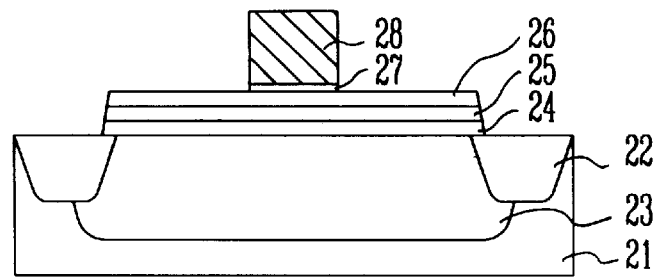

Referring now to FIG. 2B, a gate oxide film 27 is formed on the second Si layer 26 and a gate polysilicon layer is deposited on it. Then, a gate polysilicon layer pattern 28 is formed on the gate oxide film 27 by dry etching process using a mask for the gate electrode.

In the above, the deposition thickness of the gate polysilicon layer is 500 through 2000 Angstrom, preferably about 1000 Angstrom.

Figure 2C:
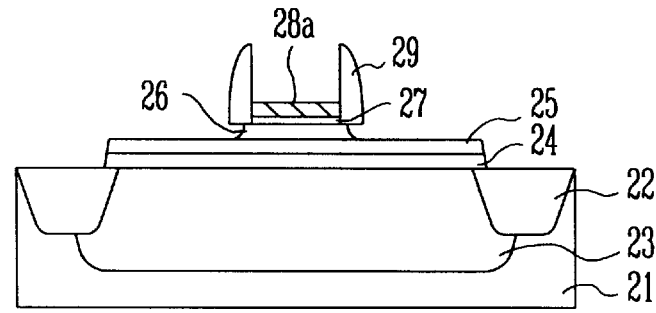

Referring to FIG. 2C, gate spacers 29 are formed on both sides of the gate polysilicon layer pattern 28. Then, a portion of the gate polysilicon layer pattern 28 is etched by wet silicon dipping to form a remaining gate polysilicon layer pattern 28a. At this time, the exposed second Si layer 26 is removed.

In the above, the gate spacers 29 are formed by depositing a nitride film in thickness of 200 through 800 Angstrom and then by performing blank dry etching process. The wet silicon dipping process uses an etching solution consisted of a mixed solution of acetic acid, nitric acid and fluoric acid, and the composition ratio of the gate polysilicon layer to the second Si layer 26 etching is selected to be about 1:1.5.

During the wet silicon dipping process, only the exposed portion of the second Si layer 26 is etched but the SiGe layer underlying it acts as an etch stop layer. Therefore, the etch time is set so that the gate polysilicon layer pattern 28 is etched about 500 through 800 Angstrom and the remaining gate polysilicon layer pattern 28a that remains after etching becomes about 50 through 200 Angstrom.

Figure 2D:
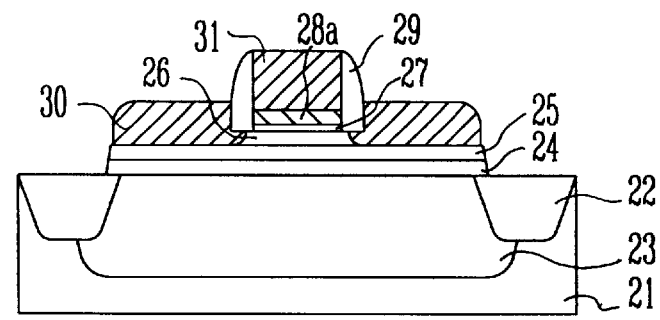

Referring now to FIG. 2D, the native oxide film is removed by the second cleaning process. Then, an epi-SiGe layer 30 and a poly-SiGe layer 31 are simultaneously formed on the exposed portions of the SiGe layer 25 and the remaining gate polysilicon layer pattern 28a, respectively, by selective SiGe growth process.

In the above, the second cleaning process includes an ex-situ cleaning process, and an in-situ cleaning process performed in the epitaxial silicon equipment. The ex-situ cleaning process is performed by RCA cleaning process or a combination of ozone cleaning process and HF dipping process. The in-situ cleaning process includes performing a hydrogen bake of 800 through 900° C. for 1 through 5 minutes before the epi-SiGe layer 30 and the poly-SiGe layer 31 are formed, thus preventing generation of any oxide films.

In case of a low-pressure chemical vapor deposition (LPCVD) method, the selective SiGe growth process includes the following deposition conditions: the deposition gases use DCS and HCl, upon deposition, DCS is 30 through 300 sccm and HCl is 30 through 200 sccm wherein $GeH_4$ of 30 through 300 sccm is introduced together for Ge doping. Also, the deposition pressure is about 10 through 50 Torr and the deposition temperature is 750 through 950° C. In case of an ultra high vacuum chemical vapor deposition (UHVCVD) method, the selective SiGe growth process includes the following deposition conditions: the deposition gases use $SiH_4$ or $Si_2H_6$ wherein $GeH_4$ of 30 through 300 sccm is introduced together for Ge doping. Also, the deposition pressure is less than 1 Torr and the deposition temperature is 600 through 750° C. The thickness of the epi-SiGe layer 30 and the poly-SiGe layer 31 formed under these conditions is about 500 through 1000 Angstrom.

Figure 2E:
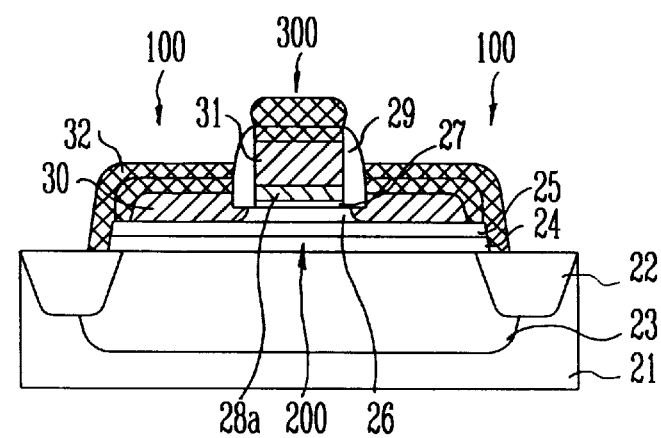

Referring now to FIG. 2E, an ion implantation process for source/drain formation and gate doping is performed. Then, a Ti layer is deposited on the entire structure and is then experienced by first annealing process, thus forming a $TiSi_2$ layer 32 at the exposed portions of the epi-SiGe layer 30 and the poly-SiGe layer 31. Then, some of the Ti layer that was not reacted is removed by first annealing process, thus completing a $TiSi_2$ layer 32 by second annealing process. Thus, a buried/elevated junction 100, in which the first Si layer 24, the SiGe layer 25, the epi-SiGe layer 30 and the $TiSi_2$ layer 32 are sequentially stacked, is formed. Also, an elevated channel 200, in which the first Si layer 24, the SiGe layer 25 and the second Si layer 26 are sequentially stacked, is defined. Further, a gate electrode 300, in which the remaining gate poly-silicon layer pattern 28a, the poly-SiGe layer 31 and the $TiSi_2$ layer 32 are sequentially stacked, is formed, In the above, the ion implantation process for source/drain formation and gate doping injects $BF_2$ ions of dose of 1E15 through 1E16 ions/cm² at the energy of 10 through 40 KeV. The TiSi₂ layer 32 is formed by depositing the Ti layer in thickness of 100 through 300 Angstrom, firstly performing a rapid thermal annealing (RTA) at the temperature of 500 through 700° C., using wet etching solution such as SC-1 etc. to remove any of the Ti layer that was not reacted and then secondly performing a rapid thermal annealing process at the temperature of 750 through 850° C.

The above embodiment of the present invention relates to a new dual gate P⁺ salicide forming technology having an elevated channel and a source/drain using the selective SiGe epi-silicon growth technology. More particularly, the present invention relates to manufacturing of a high performance surface channel- PMOS salicide which has the following effects: it can increase the current driving force by the current driving force, thus making the stress induced by the buried SiGe layer increase the carrier mobility, it has an increased current driving force effect due to reduction of the work function of the poly-SiGe being mid-band gap materials, it can improve the short channel effect by an improved gate poly depletion suppression due to an increased activation of boron at SiGe, it can suppress the leakage current at the junction by forming a buried/elevated SiGe layer at the junction portion to form a band gap engineered junction, and it can obtain a still shallower junction due to suppression of diffusion of boron doped at the junction layer.

Meanwhile, the principle of the above embodiment of the present invention can be also applied to manufacturing of a NMOS transistor.

As explained above, the present invention has the following effects: it can increase the current driving force by adopting an elevate channel structure of Si/SiGe/Si, thus making the stress induced by the buried SiGe layer increase the carrier mobility and it can maximize the current driving force effect by adopting the poly-SiGe being mid-band gap materials, thus reducing the work function compared to polysilicon. Also, it can obtain an improved SCE by a very good poly depletion prohibition effect even use of the SC-PMOS due to further high activation characteristic of boron at the poly-SiGe. Further, the present invention has the effects of prohibiting the leakage current at the junction by forming a buried/elevated SiGe junction layer to form a band gap engineered junction and of obtaining a still shallower junction due to suppression of diffusion of boron doped at the junction layer.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a transistor in a semiconductor device, comprising the steps of:
   forming a device separation film on a silicon substrate and then forming a well;
   after performing a first cleaning process, sequentially forming a first Si layer, a SiGe layer and a second Si layer by selective epi-silicon growth process and then performing ion implantation process for controlling the threshold voltage;
   forming a gate oxide film on the surface of said second Si layer and then forming a gate polysilicon layer pattern on said gate oxide film;
   forming gate spacers on both sides of said gate polysilicon layer pattern and then etching said gate polysilicon layer pattern by wet silicon dipping process, thus forming a remaining gate polysilicon layer pattern;
   after performing a second cleaning process, performing a selective SiGe growth process to form an epi-SiGe layer and a poly-SiGe layer at the exposed portions of said SiGe layer and said remaining gate polysilicon layer pattern, respectively; and
   after performing ion implantation process for source/drain formation and gate doping, depositing a Ti layer on the entire structure, removing said Ti layer that was not reacted after a first annealing process and then forming a TiSi₂ layer on the exposed portion of said epi-SiGe layer and said poly-SiGe layer by a second annealing process, thus completing a gate electrode, an elevated channel and a buried/elevated junction.

2. The method of manufacturing a transistor in a semiconductor device according to claim 1, wherein said well is formed, by implanting ions of phosphorous (P) having the dose of 1E13 through 3E13 ions/cm² at the energy of 800 through 1200 KeV and then by annealing them in the furnace at the temperature of about 950° C. for about 30 minutes to activate the dopants.

3. The method of manufacturing a transistor in a semiconductor device according to claim 1, wherein said selective epitaxial silicon growth process uses an ultra high vacuum chemical vapor deposition method or a low pressure chemical vapor deposition method to form each of said first Si layer, said SiGe layer and said second Si layer in thickness of 50 through 150 Angstrom.

4. The method of manufacturing a transistor in a semiconductor device according to claim 1, wherein when forming said first Si layer and said second Si layer by the selective epitaxial silicon growth process using the low-pressure chemical vapor deposition method, the deposition conditions are as follows: the deposition gases use DCS and HCI wherein DCS is 30 through 300 sccm upon deposition and HCI is 30 through 200 sccm, the deposition pressure is about 10 through 50 Torr and the deposition temperature is 750 through 950° C.

5. The method of manufacturing a transistor in a semiconductor device according to claim 1, wherein when forming said first Si layer and said second Si layer by the selective epitaxial silicon growth process using the ultra high vacuum chemical vapor deposition (UHVCVD) method, the deposition conditions are as follows: the deposition gases use SiH₄ or Si₂H₆, the deposition pressure is less than 1 Torr and the deposition temperature is 600 through 750° C.

6. The method of manufacturing a transistor in a semiconductor device according to claim 1, wherein when forming said SiGe layer by the selective epitaxial silicon growth process using the low-pressure chemical vapor deposition method, the deposition conditions are as follows: the deposition gases use DCS and HCI, upon deposition, DCS is 30 through 300 sccm and HCI is 30 through 200 sccm wherein GeH₄ of 30 through 300 sccm is introduced together for Ge doping, the deposition pressure is about 10 through 50 Torr and the deposition temperature is 750 through 950° C.

7. The method of manufacturing a transistor in a semiconductor device according to claim 1, wherein when forming said SiGe layer by the selective epitaxial silicon growth process using the ultra high vacuum chemical vapor deposition method, the deposition conditions are as follows: the deposition gases use SiH₄ or Si₂H₆ wherein GeH₄ of 30 through 300 sccm is introduced together for Ge doping, the deposition pressure is less than 1 Torr and the deposition temperature is 600 through 750° C.

8. The method of manufacturing a transistor in a semiconductor device according to claim 1, wherein the ion implantation process for controlling the threshold voltage is performed by implanting ions of phosphorous (P) or arsenic (As) having the dose of 1E11 through 5E12 ions/cm$^2$ at the energy of 50 through 150 KeV.

9. The method of manufacturing a transistor in a semiconductor device according to claim 1, wherein said gate polysilicon layer pattern is formed by deposition of a gate polysilicon layer in thickness of 500 through 2000 Angstrom and by dry etching process.

10. The method of manufacturing a transistor in a semiconductor device according to claim 1, wherein said gate spacer is formed by deposition of a nitride film in thickness of 200 through 800 Angstrom and by blanket dry etching process.

11. The method of manufacturing a transistor in a semiconductor device according to claim 1, wherein the wet silicon dipping process uses an etching solution consisted of a mixed solution of acetic acid, nitric acid and fluoric acid, and wherein the composition ration of said gate polysilicon layer to said second Si layer etching is selected to be about 1:15.

12. The method of manufacturing a transistor in a semiconductor device according to claim 1, wherein the wet silicon dipping process is set so that the gate polysilicon layer pattern is etched about 500 through 800 Angstrom, the remaining gate polysilicon layer pattern that remains after etching becomes about 50 through 200 Angstrom, the exposed portion of said second Si layer is etched and said SiGe layer underlying it acts as an etch stop layer.

13. The method of manufacturing a transistor in a semiconductor device according to claim 1, wherein the said first and second cleaning process includes an ex-situ cleaning process, and an in-situ cleaning process performed in the epitaxial silicon equipment.

14. The method of manufacturing a transistor in a semiconductor device according to claim 13, wherein the ex-situ cleaning process is performed by RCA cleaning process or a combination of ozone cleaning process and HF dipping process, and wherein the in-situ cleaning process includes performing a hydrogen bake of 800 through 900° C. for 1 through 5 minutes before said epi-SiGe layer is formed to prevent generation of any oxide films.

15. The method of manufacturing a transistor in a semiconductor device according to claim 1, wherein the selective SiGe growth process implements an ultra high vacuum chemical vapor deposition method or a low pressure chemical vapor deposition to form said epi-SiGe layer and said poly-SiGe layer in thickness of 500 through 1000 Angstrom.

16. The method of manufacturing a transistor in a semiconductor device according to claim 1, wherein when forming said epi-SiGe layer and said poly-SiGe layer by the selective SiGe growth process using the low-pressure chemical vapor deposition method, the deposition conditions are as follows: the deposition gases use DCS and HCl, upon deposition, DCS is 30 through 300 sccm and HCl is 30 through 200 sccm wherein GeH$_4$ of 30 through 300 sccm is introduced together for Ge doping, the deposition pressure is about 10 through 50 Torr and the deposition temperature is 750 through 950° C.

17. The method of manufacturing a transistor in a semiconductor device according to claim 1, wherein when forming said epi-SiGe layer and said poly-SiGe layer by the selective SiGe growth process using the ultra high vacuum chemical vapor deposition method, the deposition conditions are as follows: the deposition gases use SiH$_4$ or Si$_2$H$_6$ wherein GeH$_4$ of 30 through 300 sccm is introduced together for Ge doping, the deposition pressure is less than 1 Torr and the deposition temperature is 600 through 750° C.

18. The method of manufacturing a transistor in a semiconductor device according to claim 1, wherein said buried/elevated junction has a structure in which said first Si layer, said SiGe layer, said epi-SiGe layer and said TiSi$_2$ layer are stacked.

19. The method of manufacturing a transistor in a semiconductor device according to claim 1, wherein said elevated channel has a structure in which said first Si layer, said SiGe layer and said second Si layer are stacked.

20. The method of manufacturing a transistor in a semiconductor device according to claim 1, wherein said gate electrode has a structure in which said remaining gate polysilicon layer pattern, said poly-SiGe layer and said TiSi$_2$ layer are stacked.

21. The method of manufacturing a transistor in a semiconductor device according to claim 1, wherein the ion implantation for source/drain formation and gate doping includes injecting ions of BF$_2$ of dose of 1E15 through 1E16 ions/cm$^2$ at the energy of 10 through 40 KeV.

22. The method of manufacturing a transistor in a semiconductor device according to claim 1, wherein said TiSi$_2$ layer is formed by depositing said Ti layer in thickness of 100 through 300 Angstrom, firstly performing a rapid thermal annealing at the temperature of 500 through 700° C., removing any of the Ti layer that was not reacted using wet etching solution such as SC-1 etc., and secondly performing a rapid thermal annealing process at the temperature of 750 through 850° C.

* * * * *